(12) United States Patent
Saito et al.

(10) Patent No.: US 10,837,990 B2
(45) Date of Patent: Nov. 17, 2020

(54) SEMICONDUCTOR DEVICE

(71) Applicant: RENESAS ELECTRONICS CORPORATION, Tokyo (JP)

(72) Inventors: Toshiharu Saito, Tokyo (JP); Makoto Inoue, Tokyo (JP); Yasunori Kubota, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 110 days.

(21) Appl. No.: 16/173,674

(22) Filed: Oct. 29, 2018

(65) Prior Publication Data

US 2019/0178920 A1 Jun. 13, 2019

(30) Foreign Application Priority Data

Dec. 13, 2017 (JP) .................................. 2017-238738

(51) Int. Cl.
*G01R 19/165* (2006.01)
*G08B 21/18* (2006.01)
*G06F 1/30* (2006.01)

(52) U.S. Cl.
CPC . *G01R 19/16538* (2013.01); *G01R 19/16557* (2013.01); *G01R 19/16595* (2013.01); *G06F 1/30* (2013.01); *G08B 21/185* (2013.01)

(58) Field of Classification Search
CPC ........ G01R 19/16538; G01R 19/16595; G01R 19/16557; G06F 1/30; G08B 21/185
See application file for complete search history.

(56) References Cited

U.S. PATENT DOCUMENTS

| 7,725,769 | B1 | 5/2010 | Staab | |
| 2010/0088503 | A1* | 4/2010 | Eto | ........................... G06F 1/30 713/100 |
| 2010/0090730 | A1 | 4/2010 | Wu | |
| 2015/0193367 | A1* | 7/2015 | Mitsuishi | ............ G06F 12/1081 710/308 |

FOREIGN PATENT DOCUMENTS

JP 11-119872 A 4/1999

OTHER PUBLICATIONS

Extended European Search Report issued in corresponding European Patent Application No. 18203860.4, dated Apr. 17, 2019.

* cited by examiner

*Primary Examiner* — Alvaro E Fortich
*Assistant Examiner* — Zannatul Ferdous
(74) *Attorney, Agent, or Firm* — McDermott Will & Emery LLP

(57) ABSTRACT

A semiconductor device is provided which can detect a fluctuation of a power supply voltage. The semiconductor device includes a counter circuit that outputs a signal when a period during which a power supply voltage of a system to be monitored is lower than or equal to a first voltage value exceeds a predetermined time, a first flag circuit that sets a first flag based on the signal, a second flag circuit that sets a second flag when the power supply voltage becomes a second voltage value or lower, and a circuit that outputs a reset signal that resets the system when both the first and the second flags are set. The first voltage value and the second voltage value are higher than a minimum voltage that guarantees normal operation of the system. The first voltage value is higher than the second voltage value.

4 Claims, 6 Drawing Sheets

SEMICONDUCTOR DEVICE

CROSS-REFERENCE TO RELATED APPLICATIONS

The disclosure of Japanese Patent Application No. 2017-238738 filed on Dec. 13, 2017 including the specification, drawings and abstract is incorporated herein by reference in its entirety.

BACKGROUND

The present invention relates to a semiconductor device.

A target and a purpose of functional safety in an on-vehicle system are changing from failure detection to failure prevention. However, an existing voltage monitoring circuit or a semiconductor device including the voltage monitoring circuit generates an alarm after a power supply voltage indicates an abnormal value, so that the failure prevention has not been achieved.

To cope with such a problem, for example, in a power supply voltage detection circuit for detecting a state of power supply voltage of an electronic apparatus, it is considered to prevent the power supply voltage from dropping to a minimum voltage or lower by using a first voltage higher than the minimum voltage that guarantees normal operation of the electronic apparatus and a second voltage between the minimum voltage and the first voltage as threshold voltages (see Japanese Unexamined Patent Application Publication No. Hei 11(1999)-119872).

SUMMARY

However, in the invention described in Japanese Unexamined Patent Application Publication No. Hei 11(1999)-119872, there is a possibility to falsely detect a temporary voltage drop due to a load increase and frequently generate an alarm or cause an MCU to operate abnormally before the power supply voltage abnormally drops and an alarm is generated.

Therefore, a semiconductor device has been desired which can detect a fluctuation of power supply voltage within a normally operable voltage range as a sign of abnormality and generate an alarm or reset a system.

The other problems and novel features will become apparent from the description of the present specification and the accompanying drawings.

According to an embodiment, a reset signal that resets a system to be monitored is outputted based on a period of time in which a power supply voltage of the system is lower than or equal to a predetermined threshold voltage within a normally operable voltage range of the system and a level of power supply voltage value at that time.

According to the embodiment described above, it is possible to provide a semiconductor device which detects a fluctuation of power supply voltage within a normally operable voltage range as a sign of abnormality and generates an alarm or resets the system.

A microcomputer or a chip as the semiconductor device of the embodiment described above, a voltage abnormality monitoring circuit that constitutes a part of the semiconductor device, and an on-vehicle system that uses the semiconductor device, and the like are also effective as aspects of the present invention.

DETAILED DESCRIPTION

Figure 1:
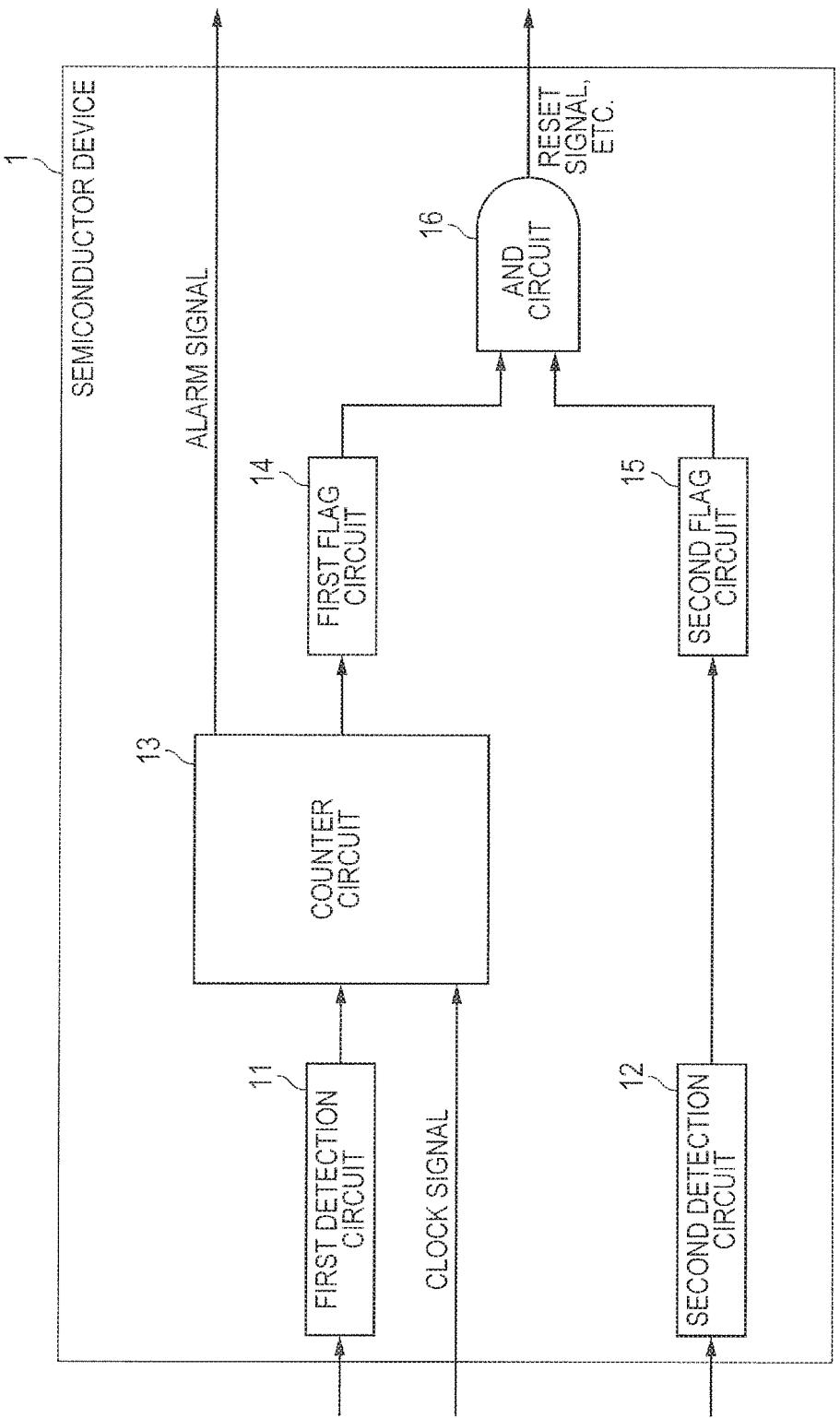
FIG. 1 is a block diagram showing a schematic configuration of a semiconductor device 1 according to a first embodiment.

For clarity of explanation, the following description and drawings are appropriately omitted and simplified. The components shown in the drawings as functional blocks that perform various processing can be formed by a CPU (Central Processing Unit), a memory, and other circuits as hardware and can be realized by a program and the like loaded in a memory as software.

Therefore, it should be understood by those skilled in the art that the functional blocks can be realized in various forms by only hardware, only software, or a combination of these, and the functional blocks are not limited to any one of hardware, software, and a combination of these. In the drawings, the same components are denoted by the same reference symbols and redundant description is omitted as appropriate.

The program described above can be stored in various types of non-transitory computer readable media and supplied to a computer.

The non-transitory computer readable media include various types of substantial recording media (tangible storage media). Examples of the non-transitory computer readable media include a magnetic recording medium (for example, flexible disk, magnetic tape, and hard disk drive), a magneto-optical recording medium (for example, magneto-optical disk), a CD-ROM (Read Only Memory), a CD-R, a CD-R/W, and a semiconductor memory (for example, mask ROM, PROM (Programmable ROM), EPROM (Erasable PROM), flash ROM, and RAM (Random Access Memory)).

The program may be supplied to a computer by various types of transitory computer readable media. Examples of the transitory computer readable media include an electrical signal, an optical signal, and an electromagnetic wave. The transitory computer readable media can supply the program to a computer through a wired communication path such as an electrical wire and an optical fiber or a wireless communication path.

First Embodiment

Next, a semiconductor device according to a first embodiment, which can detect a fluctuation of power supply voltage within a normally operable voltage range as a sign of abnormality and generate an alarm or reset a system, will be described.

The semiconductor device according to the first embodiment is, for example, monitors a power supply voltage of an on-vehicle system and outputs a reset signal that resets the on-vehicle system based on a period of time in which the power supply voltage is lower than or equal to a predetermined voltage value and a level of the power supply voltage at that time.

First, a configuration of the semiconductor device according to the first embodiment will be described.

FIG. 1 is a block diagram showing a schematic configuration of the semiconductor device 1 according to the first embodiment.

The semiconductor device 1 includes a first detection circuit 11, a second detection circuit 12, a counter circuit 13, a first flag circuit 14, a second flag circuit 15, an AND circuit 16, and the like.

The first detection circuit 11 monitors the power supply voltage of the on-vehicle system, and when detecting that the power supply voltage becomes lower than or equal to a first voltage value which is a threshold voltage, the first detection circuit 11 changes an output logical value thereof from "1" to "0".

The second detection circuit 12 also monitors the same power supply voltage, and when detecting that the power supply voltage becomes lower than or equal to a second voltage value which is another threshold voltage, the second detection circuit 12 changes an output logical value thereof from "1" to "0".

Both of the first and second voltage values are within a voltage range in which the on-vehicle system operates normally. The first voltage is higher than the second voltage. When the power supply voltage becomes lower than the first voltage value, the first detection circuit 11 may change the output logical value thereof. When the power supply voltage becomes lower than the second voltage value, the second detection circuit 12 may change the output logical value thereof.

A clock signal and an output of the first detection circuit 11 are inputted into the counter circuit 13. The counter circuit 13 counts a time width while the output logical value of the first detection circuit 11 is "0", that is, the number of times when the logical value "0" is outputted. When a time width counter value exceeds a predetermined value, the counter circuit 13 outputs an alarm signal that generates an alarm and outputs a signal to the first flag circuit 14 so that the first flag circuit 14 sets a flag.

When the time width counter value exceeds the predetermined value, the counter circuit 13 need not necessarily output the alarm signal.

The first flag circuit 14 sets a first flag by changing an output logical value of the first flag circuit 14 from "0" to "1" according to an output of the counter circuit 13.

An output of the second detection circuit 12 is inputted into the second flag circuit 15, and when an output logical value of the output becomes "0", the second flag circuit 15 sets a second flag by changing an output logical value of the second flag circuit 15 from "0" to "1".

An output of the first flag circuit 14 and an output of the second flag circuit 15 are inputted into the AND circuit 16, and when output logical values of the outputs are "1", that is, when both the first and the second flags are set, the AND circuit 16 outputs a reset signal that requests a reset or an interrupt request signal.

The first detection circuit 11 and the second detection circuit 12 are not essential in the semiconductor device 1. The first detection circuit 11 and the second detection circuit 12 may be located outside the semiconductor device 1 and the semiconductor device 1 may use outputs of the first detection circuit 11 and the second detection circuit 12.

Further, the semiconductor device 1 may includes a sampling circuit instead of the counter circuit and register circuits instead of the flag circuits.

Next, an operation of the semiconductor device 1 according to the first embodiment will be described.

Figure 2:
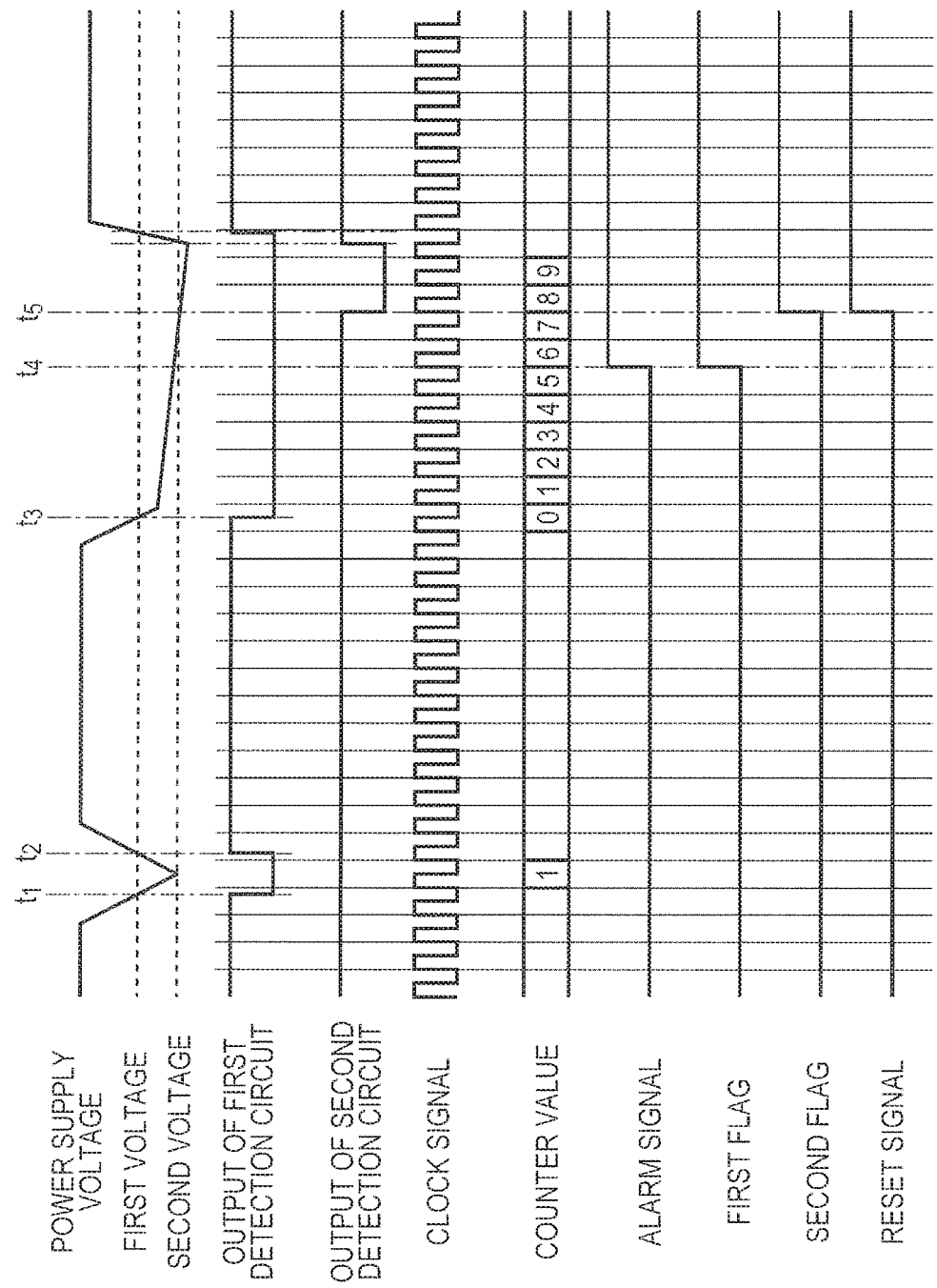
FIG. 2 is a timing chart for explaining an operation of the semiconductor device 1 according to the first embodiment.

FIG. 2 is a timing chart for explaining the operation of the semiconductor device 1 according to the first embodiment.

When the semiconductor device 1 starts an operation and a power supply voltage of a monitored on-vehicle system drops to the first voltage value or lower, the output logical value of the first detection circuit 11 changes from "1" to "0" and the counter circuit 13 starts counting of the time width (time t1).

However, the power supply voltage does not become the second voltage value or lower but immediately rises higher than the first voltage value, the output logical value of the first detection circuit 11 returns from "0" to "1", and the counter circuit 13 stops counting at "1" (time t2).

Next, after a lapse of time, when the power supply voltage drops again to the first voltage value or lower, the output logical value of the first detection circuit 11 changes from "1" to "0" again and the counter circuit 13 also starts counting of the time width (time t3).

When the time width counter value exceeds a predetermined value, here, "5", the counter circuit 13 outputs an alarm signal for the first time and sets the first flag of the first flag circuit 14 (time t4).

When the power supply voltage further drops to the second voltage value or lower, the output logical value of the second detection circuit 12 changes from "1" to "0" and the second flag of the second flag circuit 15 is set (time t5).

Then, both of the first flag and the second flag are set, so that the AND circuit 16 outputs the reset signal that requests a reset (time t5).

As described above, when the power supply voltage is lower than or equal to the first voltage value for a long time and becomes lower than or equal to the second voltage value, the semiconductor device 1 according to the first embodiment can detect the above fluctuation of the power supply voltage as a sign of abnormality by the configuration and the operation described above and inform the on-vehicle system monitored by the semiconductor device 1 of the sign of abnormality.

At this time, the semiconductor device 1 according to the first embodiment monitors a drop time width of the power supply voltage and suppresses generation of an alarm due to a temporary voltage drop accompanying an increase of load, so that the semiconductor device 1 can more accurately detect abnormality of the power supply voltage.

As described above, the semiconductor device 1 according to the first embodiment includes the counter circuit 13 that outputs a signal when a time of a state where the power supply voltage of a system to be monitored is lower than or equal to the first voltage value exceeds a predetermined time width, the first flag circuit 14 to which the signal is inputted and which sets the first flag, the second flag circuit that sets the second flag when the power supply voltage becomes the second voltage value or lower, and the AND circuit 16 that outputs the reset signal that resets the system when both the first and the second flags are set. The first voltage value and the second voltage value are higher than a minimum voltage that guarantees normal operation of the system. The first voltage value is higher than the second voltage value.

In the semiconductor device 1 according to the first embodiment, it is preferable that the counter circuit 13 outputs an alarm signal that generates an alarm when a time of a state where the power supply voltage is lower than or equal to the first voltage value exceeds a predetermined time width.

Second Embodiment

The semiconductor device 1 according to the first embodiment outputs the reset signal based on a period of time in which the power supply voltage is lower than or equal to a predetermined voltage value and a level of the power supply voltage at that time.

On the other hand, a semiconductor device according to the second embodiment further detects a sign of abnormality based on a period of time in which the power supply voltage is higher than a predetermined voltage value when the power supply voltage repeatedly rises and falls across the predetermined voltage value.

Specifically, the semiconductor device according to the second embodiment further detects a time from when the power supply voltage becomes higher than the predetermined voltage value from a voltage value lower than or equal to the predetermined voltage value to a time when the power supply voltage becomes lower than or equal to the predetermined voltage value again.

The semiconductor device according to the second embodiment, for example, also monitors a power supply voltage of an on-vehicle system.

First, a configuration of the semiconductor device according to the second embodiment will be described.

Figure 3:
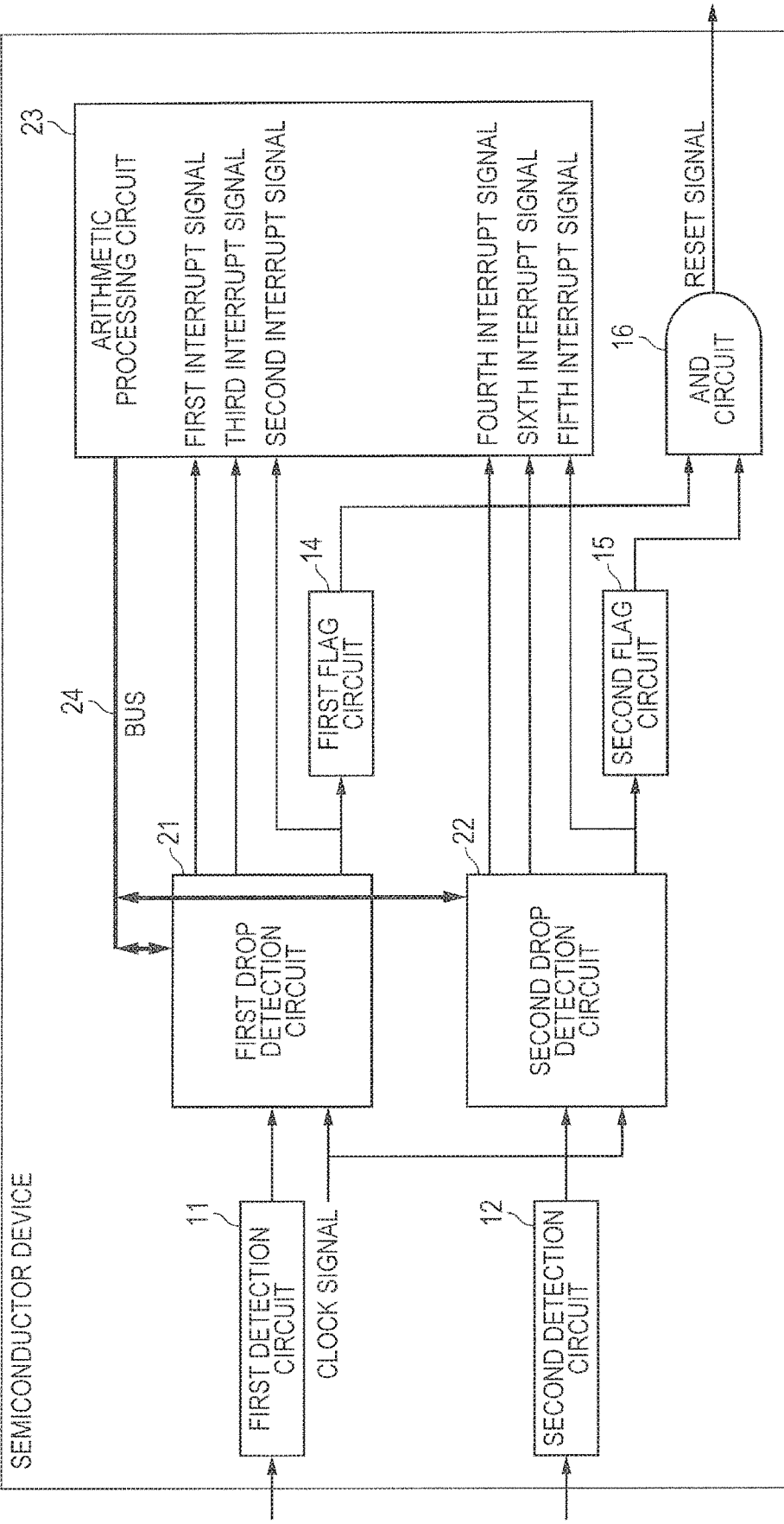
FIG. 3 is a block diagram showing a schematic configuration of a semiconductor device 2 according to a second embodiment.

FIG. 3 is a block diagram showing a schematic configuration of the semiconductor device 2 according to the second embodiment.

The semiconductor device 2 includes a first detection circuit 11, a second detection circuit 12, a first drop detection circuit 21, a second drop detection circuit 22, a first flag circuit 14, a second flag circuit 15, an AND circuit 16, an arithmetic processing circuit 23, an internal bus 24, and the like.

The first detection circuit 11, the second detection circuit 12, the first flag circuit 14, the second flag circuit 15, and the AND circuit 16 are the same as those in the first embodiment except that output destinations of the first detection circuit 11 and the second detection circuit 12 and input sources of the first flag circuit 14 and the second flag circuit 15 are changed, so that the detailed description thereof will be omitted here. The first detection circuit 11 and the second detection circuit 12 are also not essential in the semiconductor device 2. The first detection circuit 11 and the second detection circuit 12 may be located outside the semiconductor device 1.

A clock signal and an output of the first detection circuit 11 are inputted into the first drop detection circuit 21, and the first drop detection circuit 21 outputs a first interrupt signal and a third interrupt signal that respectively indicate voltage drop states to the arithmetic processing circuit 23 and outputs a second interrupt signal to the arithmetic processing circuit 23 and the first flag circuit 14.

At this time, when an output logical value "1" or "0" of the first detection circuit 11 changes, that is, when the power supply voltage becomes lower than or equal to a first voltage value or when the power supply voltage becomes higher than the first voltage value, the first drop detection circuit 21 outputs the first interrupt signal. The first interrupt signal may further function as an alarm signal in the same manner as in the first embodiment.

When a period of time in which the output logical value of the first detection circuit 11 is "0", that is, a period of time in which the power supply voltage is lower than or equal to the first voltage value, becomes greater than or equal to a predetermined time width, the first drop detection circuit 21 outputs the second interrupt signal.

When the output logical value of the first detection circuit 11 changes from "0" to "1" and then changes to "0" again, that is, when the power supply voltage increases from the first voltage value or lower to higher than the first voltage value and then becomes the first voltage value or lower again, the first drop detection circuit 21 outputs the third interrupt signal.

When a time interval from when the output logical value of the first detection circuit 11 changes from "0" to "1" to when the output logical value of the first detection circuit 11 changes to "0" again is smaller than or equal to a predetermined value, the first drop detection circuit 21 may output the third interrupt signal.

The clock signal and an output of the second detection circuit 12 are inputted into the second drop detection circuit 22, and the second drop detection circuit 22 outputs a fourth interrupt signal and a sixth interrupt signal to the arithmetic processing circuit 23 and outputs a fifth interrupt signal to the arithmetic processing circuit 23 and the second flag circuit 15.

At this time, when an output logical value "1" or "0" of the second detection circuit 11 changes, that is, when the power supply voltage becomes lower than or equal to a second voltage value or when the power supply voltage becomes higher than the second voltage value, the second drop detection circuit 22 outputs the fourth interrupt signal.

When a period of time in which the output logical value of the second detection circuit 12 is "0", that is, a period of time in which the power supply voltage is lower than or equal to the second voltage value, becomes greater than or equal to a predetermined time width, the second drop detection circuit 22 outputs the fifth interrupt signal.

When the output logical value of the second detection circuit 12 changes from "0" to "1" and then changes to "0" again, the second drop detection circuit 22 outputs the sixth interrupt signal.

When a time interval from when the output logical value of the second detection circuit 12 changes from "0" to "1" to when the output logical value of the second detection circuit 12 changes to "0" again is smaller than or equal to a predetermined value, the second drop detection circuit 22 may output the sixth interrupt signal.

The first drop detection circuit 21 and the second drop detection circuit 22 input the interrupt signals into the arithmetic processing circuit 23. The arithmetic processing circuit 23 sets (writes) various parameters to the first drop detection circuit 21 and the second drop detection circuit 22 and reads various data such as counter values of the first drop detection circuit 21 and the second drop detection circuit 22 through the internal bus 24 and stores a time width and a time interval of a drop of power supply voltage.

Further, the arithmetic processing circuit 23 resets the on-vehicle system and thereafter performs failure analysis based on the inputted interrupt signals or the read data and changes various setting values.

Therefore, the arithmetic processing circuit 23 includes a MPU, a memory, and the like (not shown in FIG. 3).

The internal bus 24 couples the first drop detection circuit 21, the second drop detection circuit 22, and the arithmetic processing circuit 23.

Specifically, the first drop detection circuit 21 has a configuration as described below.

Figure 4:
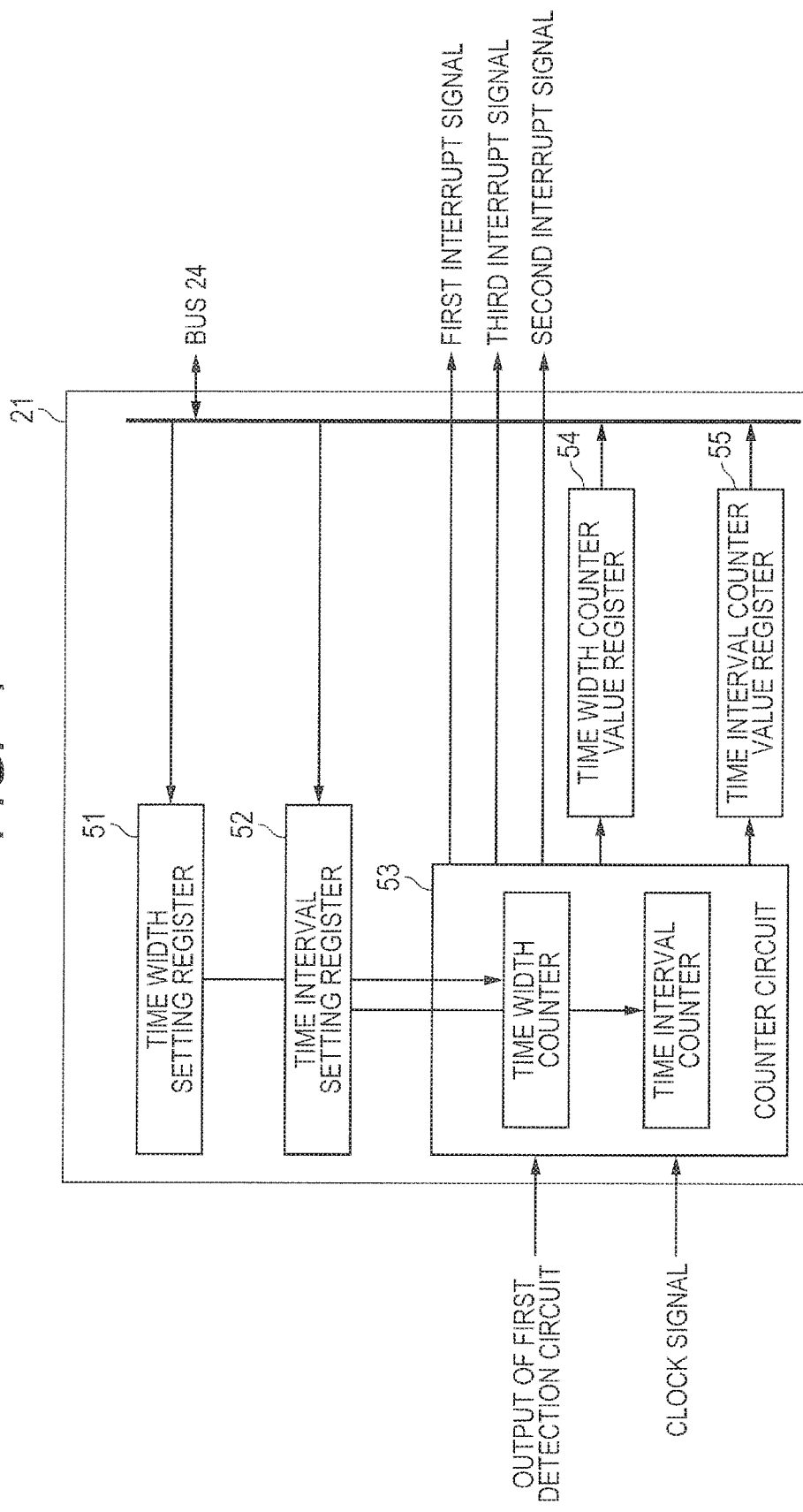
FIG. 4 is a block diagram showing a schematic configuration of a first drop detecting circuit 21 according to the second embodiment.

FIG. 4 is a block diagram showing a schematic configuration of the first drop detecting circuit 21 according to the second embodiment.

The first drop detection circuit 21 includes a time width setting register 51, a time interval setting register 52, a counter circuit 53, a time width counter value register 54, a time interval counter value register 55, and the like. The registers 51, 52, 54, and 55 correspond to interfaces between the counter circuit 53 and the arithmetic processing circuit 23.

The predetermined time width and a predetermined time interval are set into the time width setting register 51 and the time interval setting register 52, respectively, by the arithmetic processing circuit 23 through the internal bus 24, and the time width setting register 51 and the time interval setting register 52 output the time width and the time interval, respectively, to the counter circuit 53.

The clock signal and the output of the first detection circuit 11 are inputted into the counter circuit 53. When the output logical value of the first detection circuit 11 changes, the counter circuit 53 outputs the first interrupt signal.

Further, the counter circuit 53 counts a time width of output of the logical value "0" and a time interval between outputs of two continuous logical values "0". When the time width becomes greater than or equal to a predetermined value, the counter circuit 53 outputs the second interrupt signal, and when the time interval becomes greater than or equal to a predetermined value, the counter circuit 53 outputs the third interrupt signal. Therefore, the counter circuit 53 has a time width counter, a time interval counter, and the like.

Further, the counter circuit 53 outputs a counter value of time width and a counter value of time interval to the time width counter value register 54 and the time interval counter value register 55, respectively.

Counter values of the time width counter value register 54 and the time interval counter value register 55 are read by the arithmetic processing circuit 23 through the internal bus 24 when the first interrupt signal is outputted.

A schematic configuration of the second drop detecting circuit 22 is the same as that of the first drop detecting circuit 21 except that the second drop detecting circuit 22 uses an output of the second detection circuit and outputs the sixth interrupt signal to the second flag circuit 15. For example, the second drop detecting circuit 22 has a counter circuit 63 (not shown in the drawings) that is similar to the counter circuit 53. However, detailed description is omitted here.

Next, an operation of the semiconductor device 2 according to the second embodiment will be described.

Figure 5:
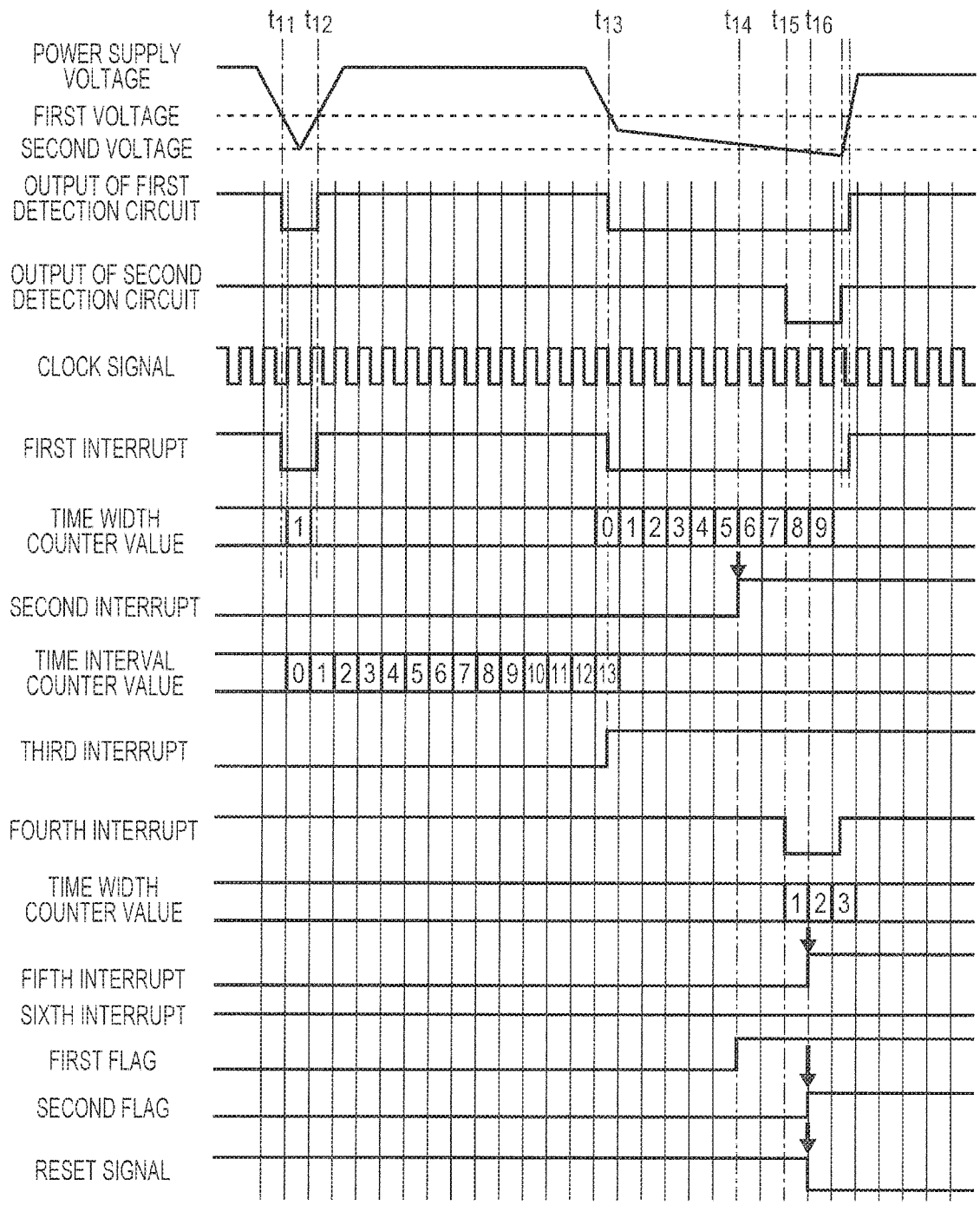
FIG. 5 is a timing chart for explaining an operation of the semiconductor device 2 according to the second embodiment.

FIG. 5 is a timing chart for explaining an operation of the semiconductor device 2 according to the second embodiment.

When the semiconductor device 2 starts an operation and a power supply voltage of a monitored on-vehicle system drops to the first voltage value or lower, the first detection circuit 11 changes its output logical value from "1" to "0" and outputs a detection signal. The detection signal is inputted into the counter circuit 53, and the counter circuit 53 outputs the first interrupt signal and starts counting of the time width (time t11).

When the first interrupt signal is outputted, a time width counter value of the time width counter value register 54 and a time interval counter value of the time interval counter value register 55 are read by the arithmetic processing circuit 23 (time t11). Thereafter, every time the first interrupt signal is outputted, the time width counter value and the time interval counter value of the first drop detection circuit 21 are read by the arithmetic processing circuit 23.

Here, the power supply voltage does not drop further but immediately rises to higher than the first voltage value, the output logical value of the first detection circuit 11 returns from "0" to "1", and the counter circuit 53 outputs the first interrupt signal again and stops counting of the time width at "1" (time t12).

Further, the counter circuit 53 starts counting of a period of time in which the power supply voltage is higher than the first voltage value, that is, counting of the time interval (time t12).

Next, when the power supply voltage drops again to the first voltage value or lower, the output logical value of the first detection circuit 11 changes from "1" to "0" again and the counter circuit 53 outputs the first interrupt signal, starts counting of the time width, and stops the counting of the time interval at "13" (time t13). The output logical value of the first detection circuit 11 changes from "0" to "1" at time t12 and thereafter changes to "0" again at this time, so that the counter circuit 53 outputs also the third interrupt signal (time t13).

When the output logical value "0" of the first detection circuit 11 continues, the counter circuit 53 continues the counting of the time width, and when the time width counter value becomes a predetermined value or more (here, "5" or more), the counter circuit 53 outputs the second output signal (time t14).

The second output signal is inputted into the first flag circuit 14, and the first flag circuit 14 sets the first flag (time t14).

When the power supply voltage further continues dropping to the second voltage value or lower, the second detection circuit 12 changes its output logical value from "1" to "0" and outputs a detection signal. The detection signal is inputted into the counter circuit 63 (not shown in the drawings) of the second drop detection circuit 22, and the counter circuit 63 outputs the fourth interrupt signal and starts counting of the time width (t15).

When the fourth interrupt signal is outputted, a time width counter value of a time width counter value register (not shown in the drawings) of the second drop detection circuit 22 and a time interval counter value of the time interval counter value register (not shown in the drawings) are read by the arithmetic processing circuit 23 (time t15). Thereafter, every time the fourth interrupt signal is outputted, the time width counter value and the time interval counter value of the second drop detection circuit 22 are read by the arithmetic processing circuit 23.

When the time width counter value becomes a predetermined value or more (here, "1" or more), the counter circuit 63 outputs the fifth interrupt signal (time t16).

The fifth interrupt signal is inputted into the second flag circuit 15, and the second flag circuit 15 sets the second flag (time t16).

Then, both of the first flag and the second flag are set, so that the AND circuit 16 outputs a reset signal that requests a reset (time t16).

The output logical value of the second detection circuit 12 does not change from "0" to "1" and to "0" again, so that the counter circuit 63 does not output the sixth interrupt signal.

The reset signal is inputted into the arithmetic processing circuit 23, and, the arithmetic processing circuit 23 determines, for example, stop of some functions of the on-vehicle system.

After the reset signal is inputted into the arithmetic processing circuit 23, the arithmetic processing circuit 23 performs failure analysis based on the inputted interrupt signals and the read counter values. Specifically, the arithmetic processing circuit 23 analyzes a stored power supply voltage value, a drop time width and a drop time interval of the power supply voltage value, and the like, learns a process and a sign where a monitored system falls into an abnormal state, and changes setting of timing of outputting the second interrupt signal and the fifth interrupt signal, that is, changes a predetermined time width.

The arithmetic processing circuit 23 may further store the inputted interrupt signals and the read data into an external storage apparatus or the like.

As described above, by the configuration and the operation described above, the semiconductor device 2 according to the second embodiment can detect a fluctuation of power supply voltage as a sign of abnormality in a situation where the power supply voltage is lower than or equal to the first voltage value for a long time and becomes lower than or equal to the second voltage value and inform the on-vehicle system monitored by the semiconductor device 2 of the sign of abnormality.

Further, by the configuration and the operation described above, the semiconductor device 2 according to the second embodiment can detect and analyze a time width and a time interval where the power supply voltage is lower than or equal to the first voltage value or lower than or equal to the second voltage value and change various setting values for detecting a fluctuation of power supply voltage. For example, the semiconductor device 2 can change various setting values and generate an alarm signal as needed before outputting the reset signal by storing each time width and each time interval before outputting the reset signal as history and analyzing and learning each time width and each time interval. Specifically, the semiconductor device 2 may generate an alarm signal when the lengths of the time width and the time interval begin to fluctuate or when the time interval becomes shorter than a predetermined time interval while the time width gradually becomes longer and the time interval gradually becomes shorter.

In the semiconductor device 2, the arithmetic processing circuit 23 may change setting such as a predetermined time width by performing failure analysis using the inputted interrupt signals without using the read counter values.

The semiconductor device 2 may have a simplified configuration where each of the first drop detection circuit 21 and the second drop detection circuit 22 has only the counter circuit 53.

The semiconductor device 2 may output various histories to an external apparatus, and results obtained by the external apparatus that has analyzed and leaned the various histories may be inputted into the semiconductor device 2 as various setting values. In other words, some or all functions of the arithmetic processing circuit 23 may be included in the external apparatus and the semiconductor device 2 may use results of the functions.

As described above, the semiconductor device 2 according to the second embodiment includes the first drop detection circuit 21 that outputs the first interrupt signal when the power supply voltage of the system to be monitored exceeds the first voltage value or falls below the first voltage value, outputs the second interrupt signal when a time of a state where the power supply voltage is lower than or equal to the first voltage value is longer than or equal to a predetermined time width, and outputs the third interrupt signal when the power supply voltage increases from the first voltage value or lower to higher than the first voltage value and then becomes the first voltage value or lower again, the second drop detection circuit 22 that outputs the fourth interrupt signal when the power supply voltage exceeds the second voltage value or falls below the second voltage value, outputs the fifth interrupt signal when a time of a state where the power supply voltage is lower than or equal to the second voltage value is longer than or equal to a predetermined time width, and outputs the sixth interrupt signal when the power supply voltage increases from the second voltage value or lower to higher than the second voltage value and then becomes the second voltage value or lower again, the first flag circuit 14 into which the second interrupt signal is inputted and which sets the first flag, the second flag circuit 15 into which the fifth interrupt signal is inputted and which sets the second flag, the AND circuit 16 that outputs the reset signal that resets the system when both the first and the second flags are set, and the arithmetic processing circuit 23 into which the first to the sixth interrupt signals are inputted and which changes the predetermined time width of the first drop detection circuit 21 or the second drop detection circuit 22. The first voltage value and the second voltage value are higher than a minimum voltage that guarantees normal operation of the system. The first voltage value is higher than the second voltage value.

It is preferable that, in the semiconductor device 2 according to the second embodiment, the first drop detection circuit 21 includes the counter circuit 53 that calculates the time width counter value of when the power supply voltage is lower than or equal to the first voltage value and the time interval counter value from when the power supply voltage increases from the first voltage value or lower to higher than the first voltage value to when the power supply voltage becomes the first voltage value or lower again, the second drop detection circuit 22 includes the counter circuit 63 that calculates the time width counter value of when the power supply voltage is lower than or equal to the second voltage value and the time interval counter value from when the power supply voltage increases from the second voltage value or lower to higher than the second voltage value to when the power supply voltage becomes the second voltage value or lower again, and the arithmetic processing circuit 23 reads the time width counter value and the time interval counter value from the first drop detection circuit 21 when the first drop detection circuit 21 outputs the first interrupt signal, reads the time width counter value and the time interval counter value from the second drop detection circuit 22 when the second drop detection circuit 22 outputs the fourth interrupt signal, and changes a predetermined time width value of the first drop detection circuit 21 or the second drop detection circuit 22 based on the time width counter value and the time interval counter value.

It is preferable that, in the semiconductor device 2 according to the second embodiment, the first drop detection circuit 21 and the second drop detection circuit 22 include a time width setting register and a time interval setting register that record a predetermined time width and a predetermined time interval inputted from the arithmetic processing circuit 23 and set the predetermined time width and the predetermined time interval into the counter circuits 53 and 56, and a time width counter value register and a time interval counter value register which record a time width counter value and a time interval counter value inputted from the counter circuits 53 and 63 and from which the time width counter value and the time interval counter value are read by the arithmetic processing circuit 23.

Third Embodiment

In the semiconductor device 2 according to the second embodiment, the drop detection circuits 21 and 22 output the third interrupt signal and the sixth interrupt signal when the output logical values of the detection circuits 11 and 12 change from "0" to "1" and then changes to "0" again.

On the other hand, in a semiconductor device according to the third embodiment, the drop detection circuits output interrupt signals when output logical values of detection circuits change from "0" to "1" and then do not change to "0" again within a predetermined period of time.

The semiconductor device according to the third embodiment, for example, also monitors a power supply voltage of an on-vehicle system.

A configuration of the semiconductor device according to the third embodiment is the same as that of the semiconductor device 2 according to the second embodiment except that the timings of when the drop detection circuits output interrupt signals are different, so that detailed description thereof is omitted here and an operation of the semiconductor device according to the third embodiment will be described using the configuration of the semiconductor device 2.

Figure 6:
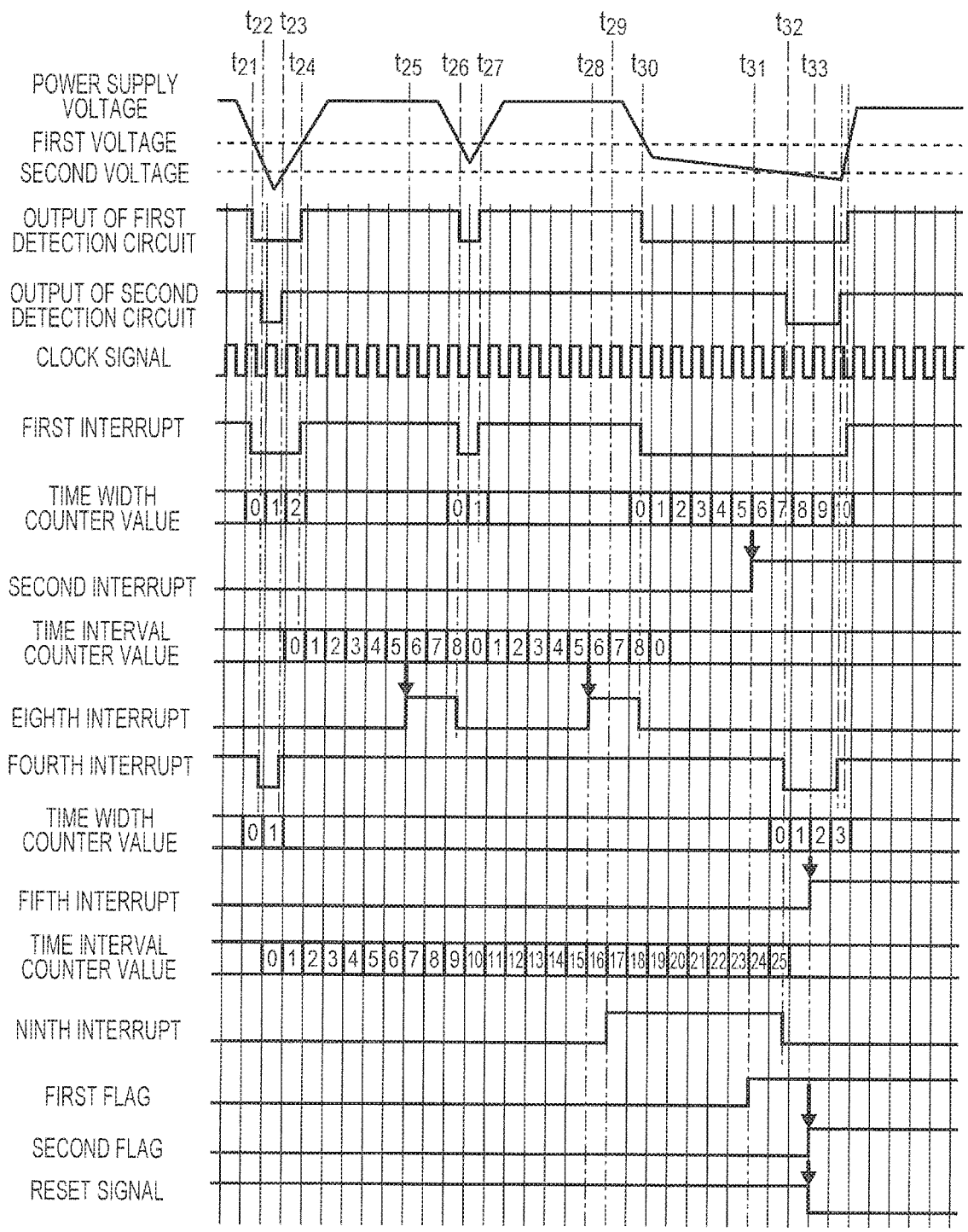
FIG. 6 is a timing chart for explaining an operation of a semiconductor device 2 according to a third embodiment.

FIG. 6 is a timing chart for explaining the operation of the semiconductor device 2 according to the third embodiment.

When the semiconductor device 2 starts an operation and a power supply voltage of a monitored on-vehicle system drops to the first voltage value or lower, the output logical value of the first detection circuit 11 changes from "1" to "0" and the counter circuit 53 of the first drop detection circuit 21 outputs the first interrupt signal and starts counting of the time width (time t21). Also in the third embodiment, every time the first interrupt signal is outputted, the time width counter value and the time interval counter value of the first drop detection circuit 21 are read by the arithmetic processing circuit 23.

Thereafter, the power supply voltage further drops to the second voltage value or lower, the output logical value of the second detection circuit 12 changes from "1" to "0", and the counter circuit 63 of the second drop detection circuit 22 outputs the fourth interrupt signal and starts counting of the time width (time t22). Here, also, every time the fourth interrupt signal is outputted, the time width counter value and the time interval counter value of the second drop detection circuit 22 are read by the arithmetic processing circuit 23.

However, the power supply voltage does not drop further but immediately rises to higher than the second voltage value, the output logical value of the second detection circuit 12 returns from "0" to "1", and the counter circuit 63 outputs the fourth interrupt signal again and stops counting of the time width at "1" (time t23).

At this time, the counter circuit 63 starts counting of a period of time in which the power supply voltage is greater than the second voltage value, that is, the time interval (time t23).

The power supply voltage further rises to higher than the first voltage value, the output logical value of the first detection circuit 11 returns from "0" to "1", and the counter circuit 53 outputs the first interrupt signal again and stops counting of the time width at "2" (time t24).

At this time, the counter circuit 53 starts counting of a period of time in which the power supply voltage is higher than the first voltage value (time t24).

When the power supply voltage is still higher than the first voltage value and does not become lower than or equal to the first voltage value again within a predetermined period of time, that is, when a time interval count value becomes higher than or equal to a predetermined value (here, "5"), the counter circuit 53 outputs an eighth interrupt signal (time t25).

Next, when the power supply voltage drops again to the first voltage value or lower, the output logical value of the first detection circuit 11 changes from "1" to "0" and the counter circuit 53 outputs the first interrupt signal and starts counting of the time width (time t26).

At this time, the counter circuit 53 outputs the eighth interrupt signal again and stops counting of the time interval at "8" (time t26).

The power supply voltage does not become the second voltage value or lower but immediately rises to higher than the first voltage value, so that the output logical value of the first detection circuit 11 returns from "0" to "1", and the counter circuit 53 outputs the first interrupt signal again and stops counting of the time width at "1" (time t27).

Further, the counter circuit 53 starts counting the time interval again (time t27).

When the time interval count value becomes higher than or equal to a predetermined value "5", the counter circuit 53 outputs the eighth interrupt signal again (time t28).

When the power supply voltage is still higher than the second voltage value and does not become lower than or equal to the second voltage value again within a predetermined period of time, that is, when the time interval count value becomes higher than or equal to a predetermined value (here, "16"), the counter circuit 63 outputs an ninth interrupt signal (time t29).

Next, when the power supply voltage drops again to the first voltage value or lower, the output logical value of the first detection circuit 11 changes from "1" to "0" and the counter circuit 53 outputs the first interrupt signal and starts counting of the time width (time t30).

At this time, the counter circuit 53 outputs the eighth interrupt signal again and stops counting of the time interval at "8" (time t30).

When the power supply voltage is still lower than or equal to the first voltage value and the output logical value "0" of the first detection circuit 11 continues, the counter circuit 53 continues the counting of the time width, and when the time width counter value becomes a predetermined value or more (here, "5" or more), the counter circuit 53 outputs the second output signal (time t31).

The second output signal is inputted into the first flag circuit 14, and the first flag circuit 14 sets the first flag (time t31).

When the power supply voltage further drops to the second voltage value or lower, the output logical value of the second detection circuit 12 changes from "1" to "0", and the counter circuit 63 outputs the fourth interrupt signal and starts counting of the time width (time t32).

When the time width counter value becomes a predetermined value or more (here, "1" or more), the counter circuit 63 outputs the fifth output signal (time t33).

The fifth interrupt signal is inputted into the second flag circuit 15, and the second flag circuit 15 sets the second flag (time t33).

Then, both of the first flag and the second flag are set, so that the AND circuit 16 outputs a reset signal that requests a reset (time t33).

The reset signal is inputted into the arithmetic processing circuit 23, and, the arithmetic processing circuit 23 determines, for example, stop of some functions of the on-vehicle system.

Further, after the reset signal is inputted into the arithmetic processing circuit 23, the arithmetic processing circuit 23 performs failure analysis based on the inputted interrupt signals and the read data. Specifically, the arithmetic processing circuit 23 analyzes a stored power supply voltage value, a drop time width and a drop time interval of the power supply voltage value, and the like, learns a process and a sign where a monitored system falls into an abnormal state, and changes setting of timing of outputting the second interrupt signal and the fifth interrupt signal, that is, changes a predetermined time width.

For example, the arithmetic processing circuit 23 may predict a time when the monitored system falls into an abnormal state based on the number of repetition times of the eighth interrupt signal or the ninth interrupt signal.

As described above, by the configuration and the operation described above, the semiconductor device 2 according to the third embodiment can detect a fluctuation of power supply voltage as a sign of abnormality in a situation where the power supply voltage is lower than or equal to the first voltage value for a long time and becomes lower than or equal to the second voltage value and inform the on-vehicle system monitored by the semiconductor device 2 of the sign of abnormality.

Further, by the configuration and the operation described above, the semiconductor device 2 according to the third embodiment can detect and analyze a time width and a time interval where the power supply voltage is lower than or equal to the first voltage value or lower than or equal to the second voltage value and change various setting values for detecting a fluctuation of power supply voltage.

Also in the semiconductor device 2 according to the third embodiment, the arithmetic processing circuit 23 may change setting such as the drop time width by performing failure analysis using the inputted interrupt signals without using the read counter values.

As described above, the semiconductor device 2 according to the third embodiment includes the first drop detection circuit 21 that outputs the first interrupt signal when the power supply voltage of the system to be monitored exceeds the first voltage value or falls below the first voltage value, outputs the second interrupt signal when a time of a state where the power supply voltage is lower than or equal to the first voltage value is longer than or equal to a predetermined time width, and outputs the third interrupt signal when the power supply voltage increases from the first voltage value or lower to higher than the first voltage value and does not become the first voltage value or lower for a predetermined time interval or more, the second drop detection circuit 22 that outputs the fourth interrupt signal when the power supply voltage exceeds the second voltage value or falls below the second voltage value, outputs the fifth interrupt signal when a time of a state where the power supply voltage is lower than or equal to the second voltage value is longer than or equal to a predetermined time width, and outputs the sixth interrupt signal when the power supply voltage increases from the second voltage value or lower to higher than the second voltage value and does not become the second voltage value or lower for a predetermined time interval or more, the first flag circuit 14 into which the second interrupt signal is inputted and which sets the first flag. She second flag circuit 15 into which the fifth interrupt signal is inputted and which sets the second flag, the AND circuit 16 that outputs the reset signal that resets the system when both the first and the second flags are set, and the arithmetic processing circuit 23 into which the first to the sixth interrupt signals are inputted and which changes the predetermined time width of the first drop detection circuit 21 or the second drop detection circuit 22. The first voltage value and the second voltage value are higher than a minimum voltage that guarantees normal operation of the system. The first voltage value is higher than the second voltage value.

While the invention made by the inventors has been specifically described based on the embodiments, it is needless to say that the present invention is not limited to the embodiments and may be variously modified without departing from the scope of the invention.

What is claimed is:

1. A semiconductor device comprising:
   a first drop detection circuit that outputs a first interrupt signal when a power supply voltage of a system to be monitored exceeds a first voltage value or falls below the first voltage value, outputs a second interrupt signal when a time of a state where the power supply voltage is lower than or equal to the first voltage value is longer than or equal to a predetermined time width of the first drop detection circiut, and outputs a third interrupt signal when the power supply voltage increases from the first voltage value or lower to higher than the first voltage value and then becomes the first voltage value or lower again;
   a second drop detection circuit that outputs a fourth interrupt signal when the power supply voltage exceeds a second voltage value or falls below the second voltage value, outputs a fifth interrupt signal when a time of a state where the power supply voltage is lower than or equal to the second voltage value is longer than or equal to a predetermined time width the second drop detection circiut, and outputs a sixth interrupt signal when the power supply voltage increases from the second voltage value or lower to higher than the second voltage value and then becomes the second voltage value or lower again;
   a first flag circuit into which the second interrupt signal is inputted and which sets a first flag;
   a second flag circuit into which the fifth interrupt signal is inputted and which sets a second flag;
   a circuit that outputs a reset signal that resets the system when both the first and the second flags are set; and
   an arithmetic processing circuit into which the first to the sixth interrupt signals are inputted and which changes the predetermined time width of the first drop detection circuit or the second drop detection circuit,
   wherein the first voltage value and the second voltage value are higher than a minimum voltage that guarantees normal operation of the system, and the first voltage value is higher than the second voltage value.

2. The semiconductor device according to claim 1,
   wherein the first drop detection circuit includes a counter circuit that calculates a time width counter value of when the power supply voltage is lower than or equal to the first voltage value and a time interval counter value from when the power supply voltage increases from the first voltage value or lower to higher than the first voltage value to when the power supply voltage becomes the first voltage value or lower again,
   wherein the second drop detection circuit includes a counter circuit that calculates a time width counter value of when the power supply voltage is lower than or equal to the second voltage value and a time interval counter value from when the power supply voltage increases from the second voltage value or lower to higher than the second voltage value to when the power supply voltage becomes the second voltage value or lower again, and wherein the arithmetic processing circuit
reads the time width counter value and the time interval counter value from the first drop detection circuit when the first drop detection circuit outputs the first interrupt signal,
reads the time width counter value and the time interval counter value from the second drop detection circuit when the second drop detection circuit outputs the fourth interrupt signal, and
changes the predetermined time width of the first drop detection circuit or the second drop detection circuit based on the time width counter value and the time interval counter value.

3. The semiconductor device according to claim 2, wherein the first drop detection circuit and the second drop detection circuit include
a time width setting register and a time interval setting register that record the predetermined time width and a predetermined time interval inputted from the arithmetic processing circuit and set the predetermined time width and the predetermined time interval into the counter circuits, and
a time width counter value register and a time interval counter value register which record the time width counter value and the time interval counter value inputted from the counter circuits and from which the time width counter value and the time interval counter value are read by the arithmetic processing circuit.

4. A semiconductor device comprising:
a first drop detection circuit that outputs a first interrupt signal when a power supply voltage of a system to be monitored exceeds a first voltage value or falls below the first voltage value, outputs a second interrupt signal when a time of a state where the power supply voltage is lower than or equal to the first voltage value is longer than or equal to a predetermined time width of the first drop detection circiut, and outputs a third interrupt signal when the power supply voltage increases from the first voltage value or lower to higher than the first voltage value and does not become the first voltage value or lower for a predetermined time interval or more;
a second drop detection circuit that outputs a fourth interrupt signal when the power supply voltage exceeds a second voltage value or falls below the second voltage value, outputs a fifth interrupt signal when a time of a state where the power supply voltage is lower than or equal to the second voltage value is longer than or equal to a predetermined time width of the second drop detection circuit, and outputs a sixth interrupt signal when the power supply voltage increases from the second voltage value or lower to higher than the second voltage value and does not become the second voltage value or lower for a predetermined time interval or more;
a first flag circuit into which the second interrupt signal is inputted and which sets a first flag;
a second flag circuit into which the fifth interrupt signal is inputted and which sets a second flag;
a circuit that outputs a reset signal that resets the system when both the first and the second flags are set; and
an arithmetic processing circuit into which the first to the sixth interrupt signals are inputted and which changes the predetermined time width of the first drop detection circuit or the second drop detection circuit,
wherein the first voltage value and the second voltage value 5 are higher than a minimum voltage that guarantees normal operation of the system, and the first voltage value is higher than the second voltage value.

* * * * *